(12) United States Patent
Fautz et al.

(10) Patent No.: US 10,416,258 B2
(45) Date of Patent: Sep. 17, 2019

(54) CONTROLLING MAGNETIC RESONANCE SYSTEMS

(71) Applicants: Hans Peter Fautz, Forchheim (DE); Rene Gumbrecht, Herzogenaurach (DE)

(72) Inventors: Hans Peter Fautz, Forchheim (DE); Rene Gumbrecht, Herzogenaurach (DE)

(73) Assignee: Siemens Aktiengesellschaft, München (DE)

( * ) Notice: Subject to any disclaimer, the term of this patent is extended or adjusted under 35 U.S.C. 154(b) by 1548 days.

(21) Appl. No.: 13/856,231

(22) Filed: Apr. 3, 2013

(65) Prior Publication Data
US 2013/0265049 A1 Oct. 10, 2013

(30) Foreign Application Priority Data
Apr. 5, 2012 (DE) .................. 10 2012 205 664

(51) Int. Cl.
*G01R 33/54* (2006.01)
*G01R 33/483* (2006.01)
(Continued)

(52) U.S. Cl.
CPC ....... *G01R 33/543* (2013.01); *G01R 33/4833* (2013.01); *G01R 33/3415* (2013.01); *G01R 33/4836* (2013.01); *G01R 33/5659* (2013.01)

(58) Field of Classification Search
USPC .................. 324/300–322; 600/407–435; 382/128–131
See application file for complete search history.

(56) References Cited

U.S. PATENT DOCUMENTS 4,318,043 A * 3/1982 Crooks ............... G01R 33/54
324/309
4,480,228 A 10/1984 Bottomley ............. 324/309
(Continued)

FOREIGN PATENT DOCUMENTS

CN 1310343 A 8/2001
CN 1355425 A 6/2002
(Continued)

OTHER PUBLICATIONS

German Office Action dated Feb. 7, 2013 for corresponding German Patent Application No. DE 10 2012 205 664.5 with English translation.
(Continued)

*Primary Examiner* — Melissa J Koval
*Assistant Examiner* — Tiffany A Fetzner
(74) *Attorney, Agent, or Firm* — Lempia Summerfield Katz LLC

(57) ABSTRACT

A method for controlling a magnetic resonance system outputs a pulse sequence including a first slice-selective excitation pulse that excites a first slice with a first magnetization. The pulse sequence includes a second slice-selective excitation pulse that excites a second slice with the first magnetization and a third slice-selective excitation pulse that excites the first slice with a second magnetization that cancels the first magnetization. The pulse sequence also includes and a fourth slice-selective excitation pulse that excites the second slice with a magnetization that cancels the first magnetization. The first slice and the second slice intersect.

24 Claims, 6 Drawing Sheets

(51) Int. Cl.
*G01R 33/565* (2006.01)
*G01R 33/3415* (2006.01)

(56) References Cited

U.S. PATENT DOCUMENTS

| | | | | |
|---|---|---|---|---|
| 4,728,890 | A * | 3/1988 | Pattany | G01F 1/716 324/309 |
| 4,737,714 | A | 4/1988 | Masatoshi Nahawa | 324/309 |
| 4,970,465 | A | 11/1990 | Hagiwara | |
| 4,999,580 | A * | 3/1991 | Meyer | G01R 33/446 324/309 |
| 5,619,138 | A * | 4/1997 | Rourke | G01R 33/446 324/309 |
| 5,751,145 | A | 5/1998 | Shimizu | |
| 5,786,692 | A * | 7/1998 | Maier | G01R 33/56341 324/307 |
| 6,541,971 | B1 | 4/2003 | Dannels | 324/309 |
| 7,193,417 | B2 * | 3/2007 | Forbes | G01R 33/3806 324/309 |
| 7,705,594 | B2 * | 4/2010 | Xu | G01R 33/4833 324/307 |
| 7,723,987 | B2 * | 5/2010 | Bito | G01R 33/4833 324/307 |
| 8,063,637 | B2 * | 11/2011 | Xu | G01R 33/5612 324/314 |
| 8,198,892 | B2 * | 6/2012 | Doyle | G01R 33/56325 324/309 |
| 8,742,759 | B2 * | 6/2014 | Soutome | G01R 33/365 324/318 |
| 2002/0041283 | A1 | 4/2002 | Sato et al. | |
| 2003/0169044 | A1 | 9/2003 | Sato | |
| 2005/0057250 | A1 | 3/2005 | Asano | |
| 2005/0104592 | A1 * | 5/2005 | Forbes | G01R 33/3806 324/318 |
| 2007/0145975 | A1 | 6/2007 | Feiweier et al. | |
| 2008/0150530 | A1 | 6/2008 | Miyoshi | |
| 2008/0238425 | A1 * | 10/2008 | Xu | G01R 33/4833 324/322 |
| 2009/0085563 | A1 * | 4/2009 | Bito | G01R 33/4833 324/307 |
| 2010/0264926 | A1 * | 10/2010 | Xu | G01R 33/5612 324/313 |
| 2010/0271020 | A1 * | 10/2010 | Doyle | G01R 33/5613 324/309 |
| 2011/0121834 | A1 * | 5/2011 | Soutome | G01R 33/365 324/318 |
| 2013/0265049 | A1 * | 10/2013 | Fautz | G01R 33/543 324/309 |

FOREIGN PATENT DOCUMENTS

| | | |
|---|---|---|
| CN | 1442113 A | 9/2003 |
| CN | 1987510 A | 6/2007 |
| DE | 3722443 A1 | 2/1988 |
| DE | 3722443 A1 | 2/1988 |
| JP | 63046146 A | 2/1988 |
| JP | H05176912 A | 7/1993 |
| JP | 2005137782 A | 6/2005 |
| JP | 2010075561 A | 4/2010 |
| KR | 19970009749 A | 3/1997 |
| KR | 20050027947 A | 3/2005 |
| KR | 20080059063 A | 6/2008 |

OTHER PUBLICATIONS

John Pauley et al., "A k-Space Analysis of Small-Tip-Angle Excitation", Journal of Magnetic Resonance, vol. 81, pp. 43-56, (1989).
Grissom et al., "Spatial Domain Method for the Design of RF Pulses in Multicoil Parallel Excitation", Magnetic Resonance in Medicine, vol. 56, pp. 620-629, (2006).
R. Gumbrecht et al., "Fast High-Flip pTX Pulse Design to Mitigate B1+ Inhomogeneity Using Composite Pulses at 7T" (2010).
U. Katscher et al., "Transmit Sense", Magnetic Resonance in Medicine vol. 49, pp. 144-150, (2003).
Chinese office Action for related Chinese Application No. 201310112234.0 dated Dec. 25, 2015, with English Translation.
Collins, Christopher M. et al; "Array-Optimized Composite Pulse for Excellent Whole-Brain Homogeneity in High-Field MRI," in Magnetic Resonance in Medicine, vol. 57, pp. 470-474, (2007).
Korean office Action for related Korean Application No. 10-2013-0037444 dated May 23, 2016.
Korean Notice of Allowance for related Korean Application No. 10-2013-0037444 dated Aug. 1, 2018.

* cited by examiner

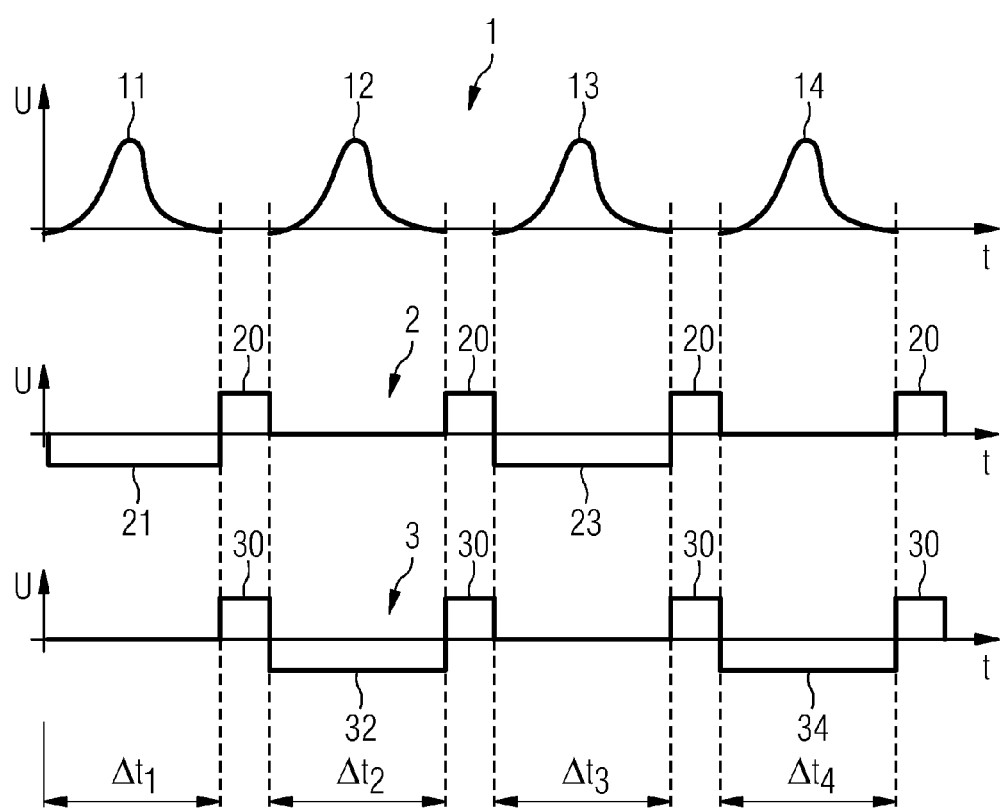

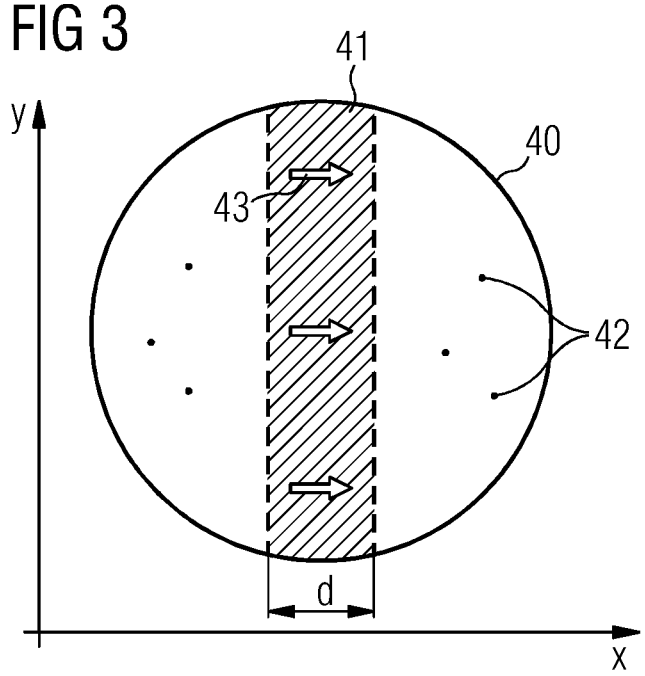
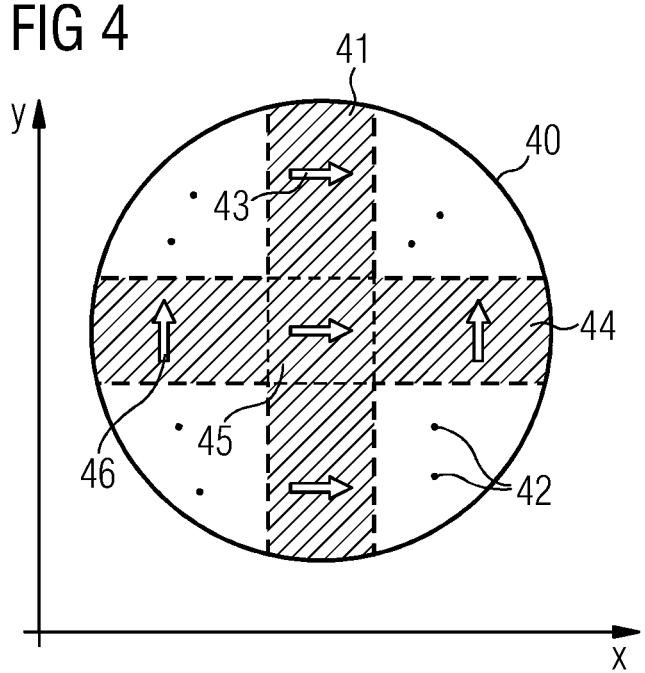

FIG 7
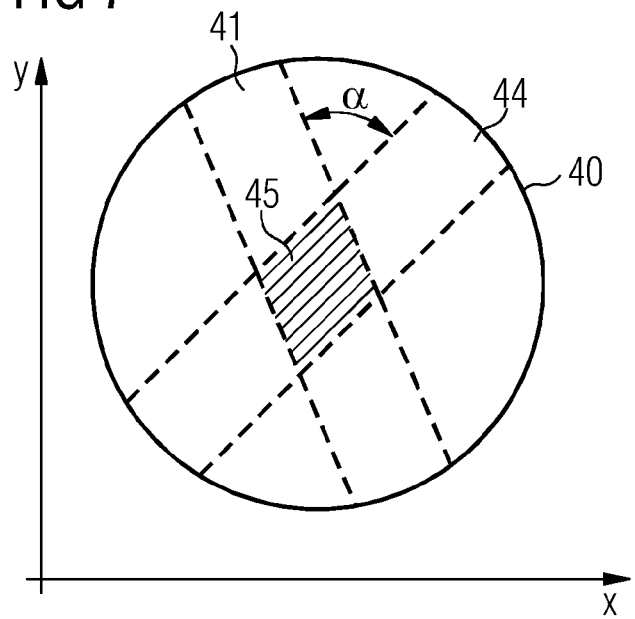
FIG 8
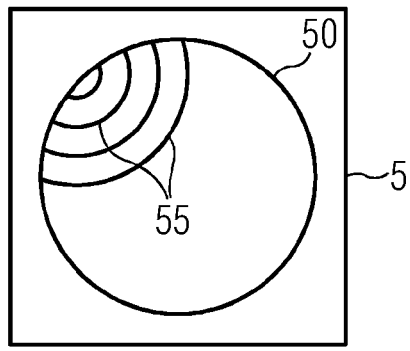
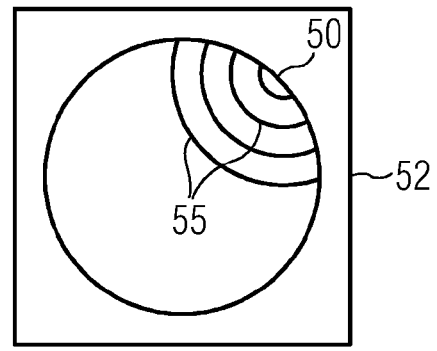
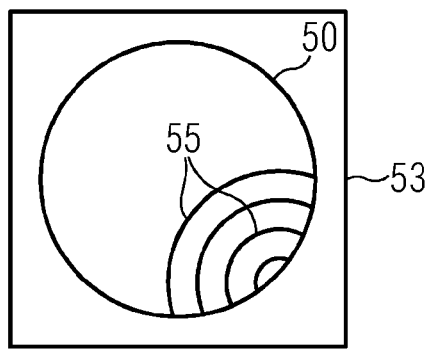
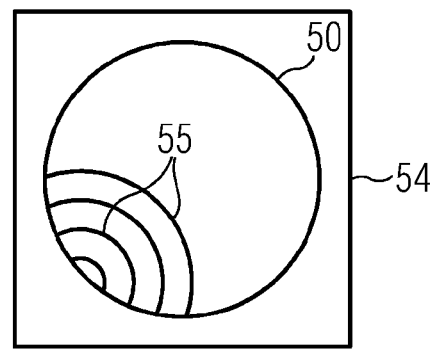

CONTROLLING MAGNETIC RESONANCE SYSTEMS

RELATED APPLICATIONS

This application claims the benefit of German Patent Application No. DE 102012205664.5, filed Apr. 5, 2012, the entire contents of which are hereby incorporated herein by reference.

TECHNICAL FIELD

The present teachings relate generally to controlling magnetic resonance systems.

BACKGROUND

Magnetic resonance tomography (e.g., nuclear spin tomography) is a widely used technique for obtaining images from inside the body of a living object of investigation. In order to obtain an image using this procedure (e.g., to generate a magnetic resonance image (MRI) of an object of investigation), the patient's body or body part to be examined is first exposed to a static basic magnetic field (e.g., a $B_0$ field) that is as homogeneous as possible. This static basic magnetic field may be generated by a basic field magnet of the magnetic resonance measuring device. The relatively high basic magnetic field has, for example, a magnetic flux density of 3 or 7 Tesla.

Rapidly switched gradient fields generated by gradient coils are superimposed on the basic magnetic field during the recording of the magnetic resonance images for the purpose of spatial encoding. In addition, HF pulses with a defined field strength are beamed by a high-frequency antenna into the scanning volume in which the object of investigation is located. The magnetic flux density of these HF pulses may be designated as $B_1$. Thus, the name of the pulse-shaped high-frequency field may also be abbreviated as $B_1$ field.

The nuclear spins of the atoms in the object of investigation are excited by these HF pulses such that the nuclear spins are deflected from an equilibrium position around an "excitation flip angle" (also referred to herein as "flip angle") that runs parallel to the basic magnetic field $B_0$. The nuclear spins precess around the direction of the basic magnetic field $B_0$. In other words, resonantly excited atoms are tilted, with spatial resolution, by a defined flip angle in relation to the magnetic field lines of the basic magnetic field. Excitation (e.g., tilting) is provided if the $B_1$ field is in resonance with the atoms to be excited (e.g., hydrogen atoms).

This magnetic resonance excitation (MR excitation) by magnetic high-frequency pulses or the resulting flip angle distribution is also designated as "nuclear magnetization" or, more simply, "magnetization." After excitation, the nuclear spins relax and revert to a starting position oriented toward the $B_0$ field. When the nuclear spins are relaxed, high-frequency signals (i.e., magnetic resonance signals) are emitted and received by suitable receiving antennae prior to further processing. The receiving antennae may be the same antennae with which the high-frequency pulses are emitted or separate receiving antennas.

The emission of high-frequency signals for nuclear spin magnetization may be effected by a "whole-body coil" or "body coil". A structure of a whole-body coil may be a birdcage antenna that has a plurality of transmitter rods running parallel to the longitudinal axis. The plurality of transmitter rods are arranged around a patient chamber of the tomograph in which a patient is located during examination. The antenna rods are in each case capacitively connected to one another in a ring shape at the front. However, local coils in close proximity to the body are used more frequently for the emission of MR excitation signals. The magnetic resonance signals may be received by the local coils but, in many cases, are also received alternately or additionally by the body coil.

The magnetic resonance images of the object of investigation are produced on the basis of the received magnetic resonance signals. Each pixel in the magnetic resonance image is assigned to a small body volume (i.e., a "voxel"), and each brightness or intensity value of the pixels is linked to the magnetic resonance signal amplitude of the magnetic resonance signal received from this voxel. The connection between a resonantly-beamed HF pulse with the field strength $B_1$ and the flip angle α thus achieved is expressed by equation (1)

$$\alpha = \int_{t=0}^{\tau} \gamma \cdot B_1(t) \cdot dt,$$

where γ is the gyromagnetic ratio that may be regarded for most nuclear spin investigations as a fixed material constant, and τ is the period of the high-frequency pulse. The equation (1) presupposes a constant phase of $B_1(t)$ (e.g., a real B1). Thus, the flip angle achieved by an emitted HF pulse and the strength of the magnetic resonance signal depend not only on the duration of the HF pulse but also on the strength of the beamed $B_1$ field. Local fluctuations in the field strength of the exciting $B_1$ field may lead to unwanted variations in the received magnetic resonance signal and a distorted measurement result.

Newer magnetic resonance systems have individual transmitting antennae with separate transmission channels. For example, the body coil may be divided circumferentially, resulting in 4, 6 or 8 subantennae. A different quantity of subantennae or division in the longitudinal direction may be provided. Individual transmission channels may thus be occupied by individual HF signals. In such a case, a multichannel pulse, which, as described above, includes a plurality of individual high-frequency pulses that may be emitted in parallel via the various independent high-frequency transmission channels, is emitted. Because of the parallel emission of the individual pulses (e.g., "pTx pulses"), such a multichannel pulse train may be used, for example, as excitation, refocusing and/or inversion pulses. An antenna system with a plurality of independently controllable antenna components or transmission channels may also be referred to as a "transmit array" regardless of whether the antenna system is a whole-body antenna or an antenna arrangement in close proximity to the body.

Such pTx pulses or pulse trains based thereon may be determined beforehand for a specific planned measurement (e.g., with which pulse shape and phase the pulses are to be emitted on the individual transmission channels). A transmission k-space-gradient trajectory may be first predefined for this purpose (e.g., the locations in the k-space that are to be started up). The k-space is the spatial frequency area.

For planning of the HF pulses, the user predefines a target magnetization (e.g., a desired spatially resolved flip angle distribution), which is used as the setpoint value within the target function. The suitable HF pulses are calculated for the individual channels, so that the target magnetization achieved is as good as possible. The basis for this calculation is the Bloch equation as shown in equation (2)

$$\frac{dM}{dt} = \gamma \cdot M \times B. \quad (2)$$

Equation (2) describes the magnetization structure by a magnetization vector M in a magnetic field B, where $\gamma$ is the gyromagnetic ratio of the core to be excited.

The pulse shape may be calculated so that a pulse with a specific length is discretized into a number of very short time steps. These time steps may be between 1 and 10 µs in duration. Thus, by way of example, a pulse of between 10 and 20 ms includes over 1000 time steps.

For small flip angles, the Bloch equation produces a linear equation system shown in equation (3)

$$A \cdot b = m_{des} \quad (3),$$

in which $m_{des}$ stands for the vector of the spatially discretized target magnetization, b stands for the vector of the time discretization of the HF pulses, and A stands for a matrix containing the linear relationships resulting from the discretization of the linearized solution of the Bloch equations between the vector $m_{des}$ and the vector b. The solution provided by this equation system delivers, for each of the time steps, a complex pulse value with a real and an imaginary part, which represent the voltage amplitude and the phase of the pulse for controlling the magnetic resonance system.

A magnetization may be excited non-selectively in terms of space within the entire reach of a coil. Alternatively, a slice from the reach of the coil may be excited by frequency-selective high-frequency pulses in combination with a linear field gradient. This field gradient transfers the limited spectral bandwidth of the high-frequency pulse into a single, spatially one-dimensional, selective excitation. This transfer may be provided since an excitation takes place only if there is a resonance between the high-frequency pulse and an atom to be excited. The precession frequency, or Larmor frequency, with which a spin precesses and with which the excitation is carried out depends on the external magnetic field. The field gradient is used to modify the external magnetic field and, therefore, to modify the Larmor frequency depending on the position. Thus, the high-frequency pulses become spatially selective.

In order to accelerate the imaging process, the spatial area to be imaged may be excited only selectively. To achieve a two- or three-dimensional selective excitation, the k-space may be traversed by a field gradient. This selective excitation is analogous to the procedure for recording an image as described by Pauly et al. in "k-space analyses of small-tip-angle excitation" (NRN, 81: 43-56, 1989).

However, this method for spatially selective excitation typically leads to very long high-frequency pulses, which in turn may lead to artifacts in the excited structure. A further limitation of this method is the power deposition per excitation or generated flip angle (i.e., the excitation efficiency).

SUMMARY AND DESCRIPTION

The scope of the present invention is defined solely by the appended claims, and is not affected to any degree by the statements within this summary.

By way of introduction, some embodiments relate to a method and a control device for controlling a magnetic resonance system for outputting a pulse sequence. Some embodiments relate to a magnetic resonance tomography system (abbreviated herein as magnetic resonance system), and a control sequence determination device.

In some embodiments, a pulse sequence that facilitates a spatially selective excitation of a magnetization using shorter high-frequency pulses is provided.

BRIEF DESCRIPTION OF THE DRAWINGS

FIG. 2 shows a schematic representation of one embodiment of a pulse sequence.

FIG. 3 shows schematically an exemplary cross-section through an object of investigation with a magnetized slice after a first excitation pulse.

FIG. 4 shows schematically an exemplary cross-section through an object of investigation with a magnetized slice after a second excitation pulse.

FIG. 7 shows schematically an exemplary cross-section through an object of investigation with a magnetized area after a fourth excitation pulse, with a different slice orientation.

FIG. 8 shows a schematic representation of exemplary B1 maps for four different representative high-frequency transmission coils.

DETAILED DESCRIPTION

Figure 1:
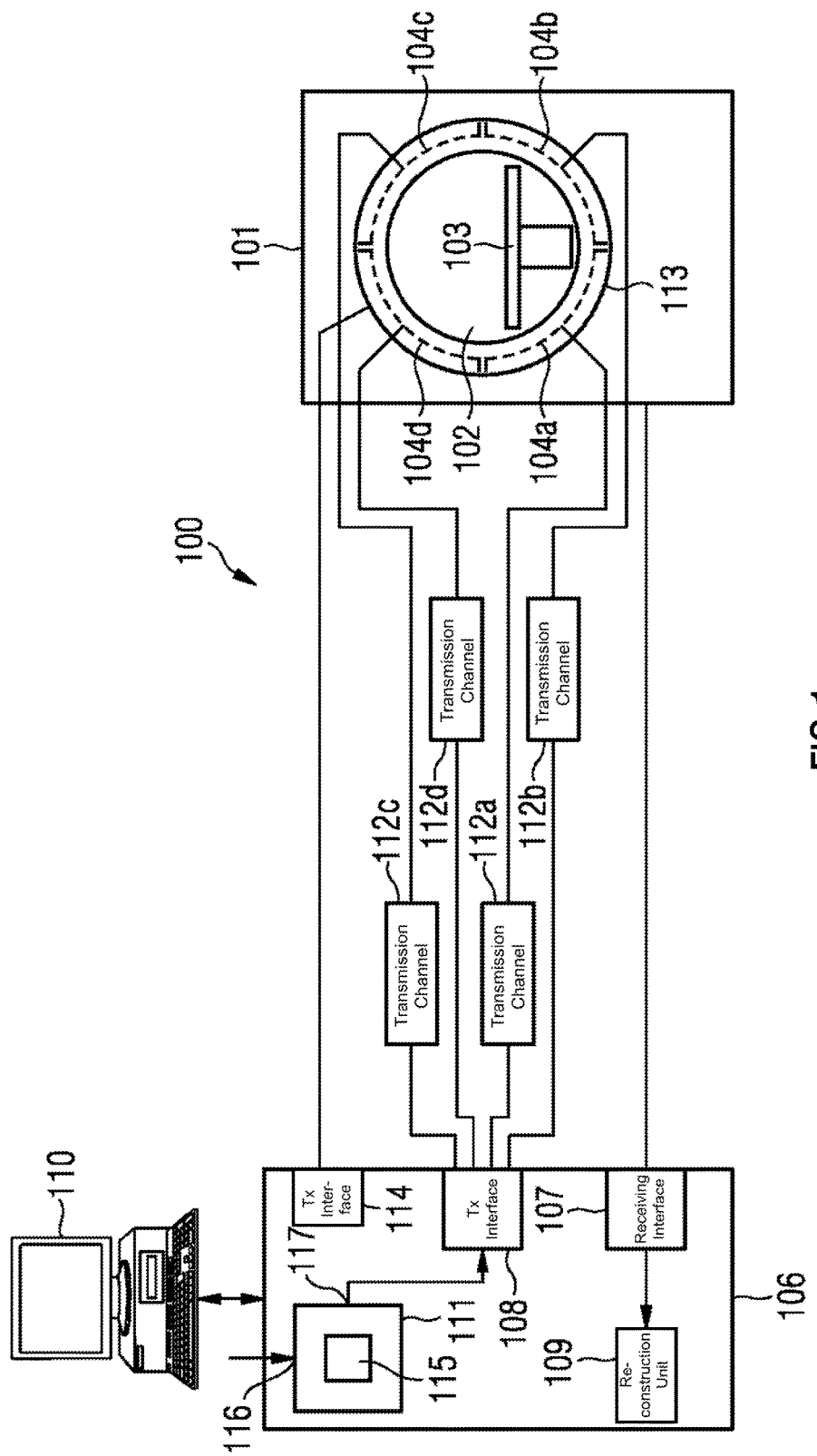
FIG. 1 shows a schematic representation of one embodiment of a magnetic resonance system.

By way of general introduction, in some embodiments, a pulse sequence output in accordance with the present teachings includes a first slice-selective excitation pulse, which excites a first slice with a first magnetization. After the first slice-selective excitation pulse is output, the nuclear spins of the atoms in this slice are thereby deflected from an equilibrium position in the reach of the transmission coil or coils (e.g., tilted in relation to the basic magnetic field). As used herein, the term "atoms" refers to the atoms that respond to the magnetic resonance (e.g., hydrogen atoms). Since magnetization is a statistical process, the nuclear spins of the slice, viewed statistically, are in the center in the tilted position. The position relative to the direction of the basic magnetic field may be specified by the average flip angle of the nuclear spin. A first magnetization signifies a tilting around a specific first axis of rotation and a flip angle of a specific first dimension.

In some embodiments, a second slice-selective excitation pulse excites a second slice with a second magnetization. The second magnetization is configured so that the second magnetization has substantially no effect on the first magnetization. A second magnetization provides a tilting around a specific second axis of rotation and a flip angle of a specific second dimension. The second slice is separate from the first slice. The non-influence on the first magnetization may, for example, be achieved by selecting the second axis of rotation so that the second axis of rotation is substantially parallel to the position of the nuclear spin after the tilting.

In some embodiments, the second slice-selective excitation pulse is followed by a third slice-selective excitation pulse that excites the first slice with a third magnetization that substantially cancels the first magnetization. The third slice-selective excitation pulse flips the nuclear spins, which were flipped out of the equilibrium position by the first slice-selective excitation pulse, back into the equilibrium position. This flipping back takes place significantly before the relaxation, thereby allowing the nuclear spins to tilt back into the equilibrium position on their own.

In some embodiments, the pulse sequence includes a fourth slice-selective excitation pulse that excites the second slice with a second magnetization that substantially cancels the second magnetization. As in the case of the third slice-selective excitation pulse, the high-frequency component is selected so that the deflected nuclear spins are tilted back to the equilibrium position, which runs parallel to the basic magnetic field $B_0$. In the equilibrium position, the nuclear spins are oriented parallel to the field lines of the basic magnetic field, with the fourth slice-selective excitation pulse affecting the nuclear spins of the second slice.

In some embodiments, the first and the second slice intersect. When the second slice-selective excitation pulse is output, the nuclear spins of the atoms in the area of intersection are already deflected by the first slice-selective excitation pulse as a consequence of the intersection of the first slice and the second slice. The second slice-selective excitation pulse has no effect on these nuclear spins, since the second magnetization or the high-frequency pulse that generates the second magnetization is configured so that the second magnetization or the high-frequency pulse that generates the second magnetization has no influence on the first magnetization (e.g., the position of the nuclear spins in the area of the first magnetization).

After the first slice-selective excitation pulse and the second slice-selective excitation pulse are output, and all nuclear spins of the atoms in the first and the second slice (as well as the nuclear spins in the area of intersection) are equally deflected (e.g., tilted by the same amount of the flip angle), the same high-frequency energy is deposited. After the third slice-selective excitation pulse is output, all nuclear spins of the atoms in the first slice, as well as the nuclear spins of atoms located in the area of intersection between the first slice and the second slice, are flipped back into the rest state or the equilibrium position.

In some embodiments, the outputting of the fourth slice-selective excitation pulse causes the nuclear spins in the second slice, insofar as the atoms are not located in the area of intersection with the first slice, to be flipped back into the equilibrium position. The spins in the area of intersection are already in the equilibrium position and are no longer in the region of the second magnetization. The high-frequency pulses of the fourth slice-selective excitation pulse affect these spins such that the spins are deflected from the equilibrium position.

Thus, after the entire pulse sequence has been output in full, a magnetization appears only in the area of intersection of the first slice and the second slice. The area of intersection defines a field of excitation (FOX), which is magnetized after the complete pulse sequence is output. In all other areas of the first and the second slice, the third and the fourth slice-selective excitation pulses have tilted each of the spins back into the equilibrium position.

As may be appreciated, all four excitation pulses are to be output in a time that is significantly shorter than the relaxation time of the spins. In such an instance, the spins are still excited (e.g., still tilted or deflected) and may be actively tilted back into the equilibrium position. Thus, the pulse sequence selectively excites a defined area (e.g., the area of intersection of the first slice and the second slice).

After excitation by a high-frequency pulse, the individual nuclear spins separate from one another in phases. To provide that the individual nuclear spins have not yet separated after the tilting, the pulse sequence including the four excitation pulses may have, for example, a total duration of less than approximately 20 to 30 ms.

In some embodiments, the first slice and the second slice may be orthogonal to one another, such that the area of intersection is a cuboid or a rod of unlimited length since the selection takes place in two dimensions. An actual limitation is effected by the finite extent of the object of investigation and by the finite area of effectiveness of the transmission coil or coils.

In some embodiments, a control device for controlling a magnetic resonance system with at least one high-frequency transmission channel is configured to emit a control signal to at least one high-frequency transmission channel, to which the control device is coupled. The control signal causes the emission of a first slice-selective excitation pulse that excites a first slice with a first magnetization, and a second slice-selective excitation pulse that excites a second slice with a second magnetization. The second magnetization is configured so that the second magnetization has substantially no effect on the first magnetization. In some embodiments, the control device is further configured so that a third slice-selective excitation pulse is emitted. The third slice-selective excitation pulse excites the first slice with a third magnetization that substantially cancels the first magnetization. The control device may also be configured so that a fourth slice-selective excitation pulse is emitted. The fourth slice-selective excitation pulse excites the second slice with a fourth magnetization that substantially cancels the second magnetization. The first slice and the second slice intersect.

In some embodiments, a control sequence determination device for determining a magnetic resonance system control sequence, which includes a pulse sequence, is provided. In some embodiments, the control sequence determination device includes an input interface for recording a target magnetization. In some embodiments, the control sequence determination device further includes an HF pulse optimization unit. The HF pulse optimization unit is configured so that, on the basis of a predefined target magnetization and a pulse sequence predefined according to the quantity and shape of pulses, the HF pulse optimization unit calculates amplitudes and phases of the pulses in a high-frequency pulse optimization. In some embodiments, the control sequence determination device further includes a control sequence output interface. The control sequence determination device is configured to use a model based on Bloch equations in the HF pulse optimization, and a spatial shape of a required excitation volume is predefined as the target magnetization. The desired excitation volume is defined by the area of intersection of the selectively excited slices. This spatial area is transferred as the target magnetization together with the desired magnetization (e.g., the desired flip angle) to an optimization algorithm. The optimization process utilizes an algorithm that models the above-described Bloch equation except for relaxation effects. Therefore, in contrast to methods based on the Fourier concept, which traverse the k-space, the present method, in some embodiments, uses the non-linear Bloch equation. Based on the high-frequency pulses and the gradients for the slice selectivity, the magnetization follows a dynamic described by the Bloch equation. Thus, the magnetization moves on what is referred to as the Bloch sphere.

In high-frequency pulse optimization, the minimization problem shown in equation (4) is resolved with a method for minimizing non-linear equation systems:

$$\min_{A,phi} (\|M(A, phi) - M_{des}\|_2). \tag{4}$$

In some embodiments, one or more of the components of the above-described control device, and also of the above-described control sequence determination device, may be implemented in a processor of the control device entirely or partially in the form of software modules. In some embodiments, this is advantageous inasmuch as existing control devices and control sequence determination devices may be retrofitted via software installation for implementation of a method in accordance with the present teachings. In some embodiments, a computer program product that may be loaded directly in a processor of a programmable control device of a medical imaging system (e.g., a magnetic resonance system) using program code in order to execute acts of a method as described herein is provided.

In some embodiments, a slice-selective excitation pulse includes a high-frequency pulse, the shape of which predefines a slice thickness of the excited slice and a delimitation accuracy or edge definition between the excited slice and a non-excited area. In some embodiments, the slice-selective excitation pulse further includes a gradient signal that predefines a slice plane. By selecting the shape of the high-frequency pulse, a good definition of the slice may be achieved. The gradient signal (e.g., the incline of the gradient signal) predefines the slice plane in combination with the high-frequency pulse.

Magnetic resonance systems have gradient coils in the x, y and z direction. By interconnecting different gradient coils, a gradient signal is possible in any spatial direction. Thus, in combination with a high-frequency pulse, a slice located randomly in the space and having a selectable slice thickness may be selectively excited.

In some embodiments, the high-frequency pulse is a sinc pulse. Sinc-pulses have an advantage of good edge definition (e.g., a high selectivity).

In some embodiments, after the fourth slice-selective excitation pulse, a refocusing pulse is output for a third slice that intersects with the first slice and the second slice. Since only an excited spin may be refocused, the refocusing pulse in a third slice therefore affects only the remaining magnetized area and cuts out an area in a third direction. Thus, the excitation is affected selectively in three spatial directions, and a 3D magnetization may be provided.

In some embodiments, the slice-selective excitation pulses include high-frequency pulses, each of which has an amplitude and a phase. This amplitude and phase are optimized so that, after the pulse sequence is output, any difference between a total excited magnetization and a magnetization in the area of intersection of the first slice and the second slice or intersection of the first slice, the second slice and the third slice is minimized. If the difference between the total excited magnetization and the magnetization in the area of intersection is reduced to zero, only the excited target area is magnetized. Thus, the third slice-selective excitation pulse and the fourth slice-selective excitation pulse have completely canceled the first magnetization (i.e., the spins outside the area of intersection are back in the state of equilibrium). This neutralization may be difficult since the magnetization is dependent on fluctuations in the local magnetic field (i.e., the magnetization depends both on fluctuations in the basic magnetic field $B_0$ and on fluctuations in the high-frequency magnetic field $B_1$).

In some embodiments, an actual distribution of a $B_1$ field is determined before optimization. Alternatively, the actual distribution of the $B_1$ field is already known, and the optimization takes the $B_1$ distribution into account. By way of example, $B_1$ maps make a statement about the selectivity of the high-frequency antenna or antennae. The antennae are not ideal emitters, and the antennae have a certain directionality or radiation characteristic that determines the $B_1$ field distribution.

In some embodiments, an actual distribution of a $B_0$ field is also determined before optimization. Alternatively, distribution of the $B_0$ field is already known from previous measurements, and the optimization takes the $B_0$ distribution into account.

The minimization problem according to equation (4) involves specification of the magnetization depending on the amplitude and the phase M(A,phi). According to the Bloch equation (2), M results from the gyromagnetic ratio and the magnetic field B. The magnetic field B is determined via equation (5):

$$B = \sum_{k} B_{1,k} A_k + \Delta B_0, \tag{5}$$

wherein k is an index for various transmission channels, $B_{1,k}$ is the indicated $B_1$ field (e.g., the $B_1$ field of the k-th antenna), $A_k$ is the complex amplitude over the k-th high-frequency pulse of the pulse sequence, and $\Delta B_0$ takes into account the $B_0$ maps.

In some embodiments, a method in accordance with the present teachings is applied in a magnetic resonance system having a transmission antenna arrangement that includes a plurality of independent high-frequency transmission channels. In some embodiments, at least two of the high-frequency transmission channels output independent pulse sequences in parallel. Each of these independent pulse sequences includes first, second, third and fourth slice-selective excitation pulses. In some embodiments, a method in accordance with the present teachings is practicable with a single antenna. In some embodiments, the use of an antenna array (e.g., a transmitting antenna arrangement including a plurality of individual antennae) leads to a clear quality improvement (e.g., to improved selectivity in the determination of the volume to be excited).

In some embodiments, the control sequence determination device takes into account, in the HF pulse optimization, a $B_1$ map of a high-frequency transmission channel or $B_1$ maps of a plurality of high-frequency transmission channels to be used for emission of the pulse sequence. Thus, the selectivity and the characteristic of each individual transmitting antenna is taken into account, and the tuning may be more refined. In each case, the third slice-selective excitation pulse and the fourth slice-selective excitation pulse are used in an effort to achieve as complete as possible a return of the excited spins to the state of equilibrium.

Representative embodiments in accordance with the present teachings will now be further described in reference to the accompanying drawing figures. It is to be understood that elements and features of the various representative embodiments described below may be combined in different ways to produce new embodiments that likewise fall within the scope of the present teachings.

FIG. 1 shows a schematic block diagram of a representative magnetic resonance tomography system 100, also referred to as a magnetic resonance system. The magnetic resonance tomography system 100 includes a standard scanner 101, in which a patient or proband (not shown in FIG. 1) may be positioned on a couch 103 for examination in a measurement chamber 102 (e.g., a "patient tunnel").

The scanner 101 has a basic magnetic field system in order to apply a basic magnetic field in the measurement chamber 102, and a gradient coil system 113, through which a pulse sequence of magnetic field gradient pulses may be emitted according to a predefined measurement protocol. Similarly, high-frequency pulses may be emitted via a high-frequency transmitting antenna arrangement, 104a-104d, for excitation of nuclear spins in an area of the object of investigation to be investigated. In some embodiments, by way of example, the antenna arrangement 104a-104d shown in FIG. 1 may be a body coil or a local transmission coil arrangement. In the embodiment shown in FIG. 1, the body coil is configured as a birdcage antenna and is divided into four individual antennae. Such a transmitting antenna arrangement, with a plurality of individual antennae 104a, 104b, 104c, and 104d that may emit high-frequency transmission pulses in parallel, is also referred to as an antenna array.

In some embodiments, the magnetic resonance signals that result from a relaxation of excited nuclear spins may also be captured by the antenna arrangement 104a-104d. However, in some embodiments, separate antennae may also be provided for this purpose.

The scanner 101 is controlled by a control device 106 of the magnetic resonance system 100. The control device 106 has different interfaces, including a high-frequency transmission interface 108. In some embodiments, desired high-frequency pulses are fed into the antenna arrangement 104a-104d through the high-frequency transmission interface 108 via at least one high-frequency transmission channel. In some embodiments, four high-frequency transmission channels 112a-112d are provided, each of which is coupled to one of the transmitting antennas 104a-104d.

In some embodiments, a gradient transmission interface 114 of the control device 106 is connected to the gradient coil arrangement 113 in the scanner 101. Gradient signals are fed into the gradient coil arrangement 113 via the gradient transmission interface 114. The gradient signals cause a locally restricted modification of the basic magnetic field. In some embodiments, the gradient coil arrangement 113 includes a gradient coil for a gradient field in the x direction, a gradient coil for a gradient field in the y direction and a gradient coil for a gradient field in the z direction. The z direction may extend along the longitudinal direction of the patient tunnel 102. Such gradient coil arrangements, which are known to those of ordinary skill in the art, facilitate local magnetic field modification in any required spatial direction.

In some embodiments, the control device 106 includes a magnetic resonance signal receiving interface 107 that receives, as raw data, the magnetic resonance signals from the antenna arrangement used for receiving, processes the magnetic resonance signals, and transfers the magnetic resonance signals to a reconstruction unit 109. The reconstruction unit 109 reconstructs the image data based on the raw data in a conventional manner, as is well known in the art.

In some embodiments, a terminal 110 is connected to the control device 106. An operator may operate the control device 106 through terminal 110 and, in turn, operate the entire magnetic resonance tomography system 100.

Other components of the scanner 101 (e.g., the basic field magnet system, the couch 103, etc.) may be controlled by the control device 106 using additional interfaces. These components are, however, known to a person skilled in the art and are therefore not shown in greater detail in FIG. 1. A magnetic resonance tomography system in accordance with the present teachings may include a variety of additional components, including but not limited to interfaces to specific networks, as will be readily appreciated by one of ordinary skill in the art.

In some embodiments, the control device 106 further includes a control sequence determination device 111 with an HF pulse optimization unit 115. In some embodiments, the control sequence determination device 111 is part of the control device 106, but may be implemented separately from the control device 106. In some embodiments, the control sequence determination device 111 may be implemented separately from the magnetic resonance system 100.

In some embodiments, the control sequence determination device 111 includes an input interface 116 into which settings (e.g., a target magnetization) may be entered using, for example, the terminal 110. In some embodiments, the control sequence determination device 111 further includes a control sequence output interface 117 at which data relating to amplitude and phase of the HF pulses to be output may be output to the high-frequency transmission interface 108.

FIG. 2 shows a schematic representation of a representative pulse sequence in accordance with the present teachings for controlling the magnetic resonance system 100. A voltage spread over time in random units, and envelope curves of high-frequency pulses as output to the transmitting antennas 104a-104d, are drawn in a Graph 1. The pulse sequence includes a first high-frequency pulse 11, a second high-frequency pulse 12, a third high-frequency pulse 13, and a fourth high-frequency pulse 14. The pulses 11, 12, 13 and 14 of a sequence are output one after another on an antenna. In a high-frequency transmission coil arrangement 104a-104d, as shown in FIG. 1, a pulse sequence that includes four high-frequency pulses is output on each coil.

The high-frequency pulses are simultaneously output with gradient signals, as shown in Graphs 2 and 3 in FIG. 2. As in Graph 1 described above, each of Graphs 2 and 3 shows a voltage over time in random units. In some embodiments, the gradient signals 21 and 23 are output via the gradient coils, which generate a gradient field in the x direction. The gradient signal 21 is applied to the x-gradient coil arrangement during the high-frequency pulse 11. No gradient signal is applied in the x direction during the high-frequency pulse 12. A gradient signal 23 is applied to the x-gradient coils during the high-frequency pulse 13. There is no gradient signal in the x direction during the outputting of the high-frequency pulse 14.

The gradient signals in the y direction are shown in Graph 3 of FIG. 2. A gradient signal 32 is applied in the y direction during the outputting of the high-frequency pulse 12, and a gradient signal 34 is applied during the outputting of the high-frequency pulse 14. There are no gradient signals in the y direction during the outputting of the high-frequency pulses 12 and 14.

Short gradient pulses 20 and 30 in the time intervals between the individual high-frequency pulses are referred to as rewinder pulses for returning to the k-space center.

Rewinder pulses are used to begin the subsequent HF pulse or a signal readout chain in a defined state. A rewinder pulse rephases a signal that was previously dephased by a slice selection gradient.

Overall, the high-frequency pulse 11 together with the gradient signal 21 forms a first slice-selective excitation pulse in the x direction during a time span $\Delta t_1$. The high-frequency pulse 12 together with the gradient signal 32 forms a second slice-selective excitation pulse in the y direction during the time span $\Delta t_2$. The high-frequency pulse 13 together with the gradient signal 23 forms a third slice-selective excitation pulse in the x direction during the time span $\Delta t_3$. The high-frequency pulse 14 together with the gradient signal 34 forms a fourth slice-selective excitation pulse in the y direction during the time span $\Delta t_4$.

In some embodiments, the length of the slice-selective excitation pulses may be between about 1 and about 3 ms, but may be greater or smaller in special cases.

The effects of an output pulse sequence according to FIG. 2 are described below in reference to FIGS. 3-6. Each of FIGS. 3-6 shows a cross-section through a body 40 under investigation. For the purpose of explaining the mode of operation, the object of investigation may be a spherical phantom. The cross-section may also represent a cross-section through a human body. The body 40 under investigation is to be located in a patient tunnel 102 of the scanner 101. As a result of the basic magnetic field, the nuclear spins in the body 40 under investigation are oriented in the z direction. In FIGS. 3-6, the z direction is perpendicular to the plane of the drawing. Nuclear spins 42 oriented in the z direction are indicated schematically by dots.

FIG. 3 shows a magnetization state of the body 40 after the first high-frequency pulse 11 is output together with the gradient signal 21. The gradient signal 21 causes a selection in the x direction. The high-frequency pulse 11 is selected so that a flip angle of 90° is achieved. The interaction of gradient signal 21 and high-frequency pulse 11 results in a slice thickness d. The shape of the high-frequency pulse determines an edge definition (e.g., the area of transition between a magnetized area and a non-magnetized area). In some embodiments, for good edge definition, the high-frequency pulse 11 may be a sinc pulse. A slice 41, which is shown in FIG. 3 as a cross-hatched area, is magnetized.

The slice-selective excitation pulse in the x direction formed by high-frequency pulse 11 and gradient signal 21 has thus deflected the nuclear spins within the slice 41 by 90° from the rest position. The high-frequency pulse 11 has a phase of 0° that defines the direction of the axis of rotation and, thus, the direction of the B1 field vectors. A 0° phase with an axis of rotation in the y direction is randomly identified. Accordingly, the axis of rotation with 90° phase points in the x direction, and the axis of rotation with 180° phase points in the y direction.

In some embodiments, the B1 field vector points in the y direction. As a result of rotation about the y-axis, a magnetization takes place in the x direction. The nuclear spins 43 are oriented in the x direction in the magnetized slice 41, as indicated by the arrows in FIG. 3.

Figure 10:
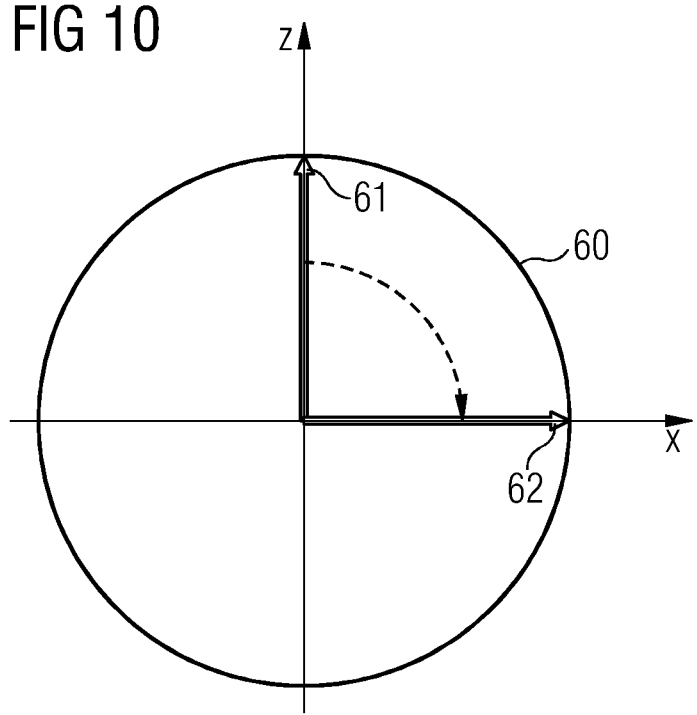
FIG. 10 shows a schematic representation of an exemplary Bloch sphere.

The tilting or rotation of the nuclear spins is described in reference to the Bloch sphere 60 shown in FIG. 10 as an illustration of the Bloch equation. As shown in FIG. 10, the Bloch sphere 60 is shown as a circle. Movements of the nuclear spins during tilting take place on the Bloch sphere 60. In FIG. 10, the z-axis is shown above the x-axis (in contrast to the different representation shown in FIGS. 3-7). A nuclear spin 61 shown in FIG. 10 is in the rest position (e.g., the equilibrium position). In other words, nuclear spin 61 is oriented in the z direction based on the external basic magnetic field $B_0$. The application of the first slice-selective excitation pulse 11, 21 causes a rotation about the y-axis that is perpendicular to the drawing plane of FIG. 10. A 90° flip angle then causes a rotation into a nuclear spin position 62 in the x direction.

FIG. 4 shows the status of the body 40 after the second high-frequency pulse 12 is output simultaneously with the gradient signal 32. The second slice-selective excitation pulse thus formed in the y direction has magnetized a slice 44, which is shown as a cross-hatched area. The above description in reference to FIG. 3 also applies for the interaction of gradient signal 32 and high-frequency pulse 12.

The second slice-selective excitation pulse 12, 32 is also configured for a flip angle of 90°. In contrast to the first slice-selective excitation pulse, the second slice-selective excitation pulse has a phase of 90°, thereby causing a rotation of the nuclear spins about an axis of rotation in the x direction. Thus, the nuclear spins 46 in the slice 44, which were still oriented in the z direction in FIG. 3, are now rotated in the y direction, as indicated by the arrows in FIG. 4. In an area 45 that designates the area of intersection between the slice 41 and the slice 44, the nuclear spins from the excitation pulse 12, 32 are not influenced since the nuclear spins are oriented in the x direction. In other words, in reference to FIG. 10, the nuclear spin 62 oriented in the x direction does not change position and orientation during a rotation about the x-axis.

In FIG. 4, all nuclear spins in the cross-hatched area are deflected around 90° from the rest position. While the nuclear spins 43 in the slice 41 including the area of intersection 45 point in the x direction, the nuclear spins 46 in the slice 44 point in the y direction with the exception of the area of intersection 45. Outside the cross-hatched areas (i.e., outside the slices 41 and 44), the spins 42 are in the rest position along the z-axis, as indicated by dots. The angle of deflection of 90° is the same in all cross-hatched areas.

The nuclear spins 43, 46 in the slices 41 and 44 are deflected from an equilibrium position (e.g., tilted). The area of intersection 45 is captured both by the slice-selective excitation pulse 11, 21 in the x direction and by the slice-selective excitation pulse 12, 32 in the y direction. Since the nuclear spins 43 are already deflected after the outputting of the first slice-selective excitation pulse (e.g., in the direction of the x-axis, which forms the axis of rotation for the second slice-selective excitation pulse), the second slice-selective excitation pulse has no effect on these nuclear spins. Therefore, the area of intersection 45 is not "doubly magnetized." Rather, the nuclear spins in area 45 have the same tilting around 90° as the nuclear spins in areas 41 and 44 and, therefore, have assumed the same high-frequency energy.

The pulse sequence shown in FIG. 2 is selective in only two spatial directions. The illustrations in FIGS. 3 to 6 show cross-sections. In each case, the magnetized areas extend in the z direction (i.e., the direction that extends upward from the drawing plane).

Figure 5:
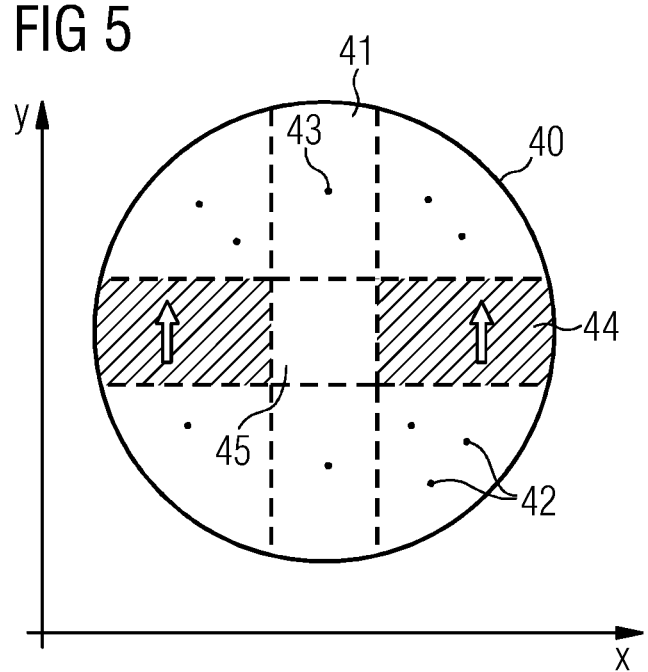
FIG. 5 shows schematically an exemplary cross-section through an object of investigation with a magnetized slice after a third excitation pulse.

FIG. 5 shows a magnetization state of the object of investigation 40 after the third slice-selective excitation pulse, which includes the high-frequency pulse 13 and the gradient signal 23, is output. The gradient signal 23 is selected so that the same slice is selected as when the first slice-selective excitation pulse was output. The strength (e.g., the amplitude) of the high-frequency pulses 11, 12, 13 and 14 is selected in each case so that the same flip angle (e.g., a 90° flip angle) is achieved. However, the high-frequency pulses differ in phases.

The high-frequency pulse 13 has a phase of 180°. This phase causes the axis of rotation to point in the negative y direction. The nuclear spins, which point in the x direction after the second slice-selective excitation pulse is output, are rotated back around 90° since the axis of rotation points in the negative y direction. Since the third excitation pulse is a slice-selective excitation pulse in the x direction, the nuclear spins 43 of the slice 41, including the area of intersection 45, are rotated back in the z direction as indicated by dots. The nuclear spins 43 are thus located in the starting position, and the slice 41 no longer has any magnetization.

Figure 6:
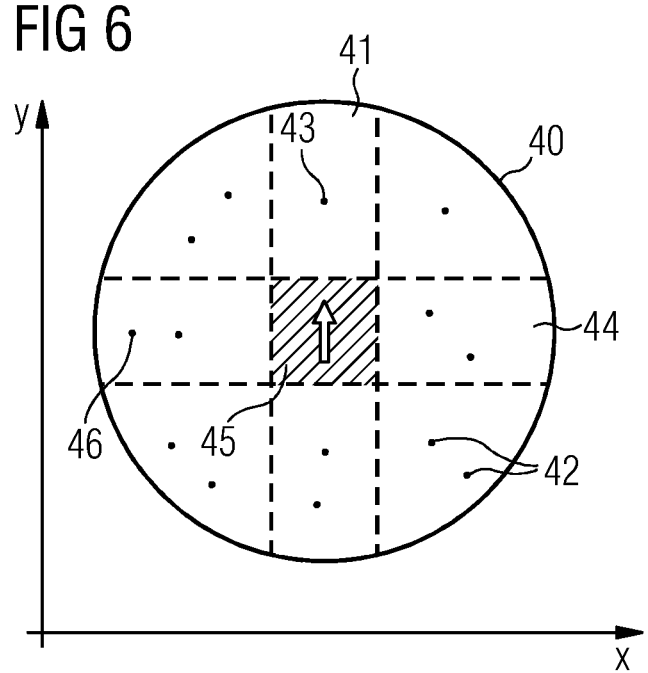
FIG. 6 shows schematically an exemplary cross-section through an object of investigation with a magnetized area after a fourth excitation pulse.

FIG. 6 shows the magnetization in the object of investigation 40 after the fourth slice-selective excitation pulse is output. The high-frequency pulse 14 is selected so that a flip angle of 90° is achieved. The phase of the high-frequency pulse 14 is −90°, which signifies an axis of rotation in the negative x direction. The nuclear spins 46 pointing in the y direction in the slice 44 after the third slice-selective excitation pulse is output, with the exception of the nuclear spins in the area of intersection 45, are rotated about the x-axis by 90° (e.g., to the rest position). However, the nuclear spins that are already in the rest position in the area of intersection 45 are turned 90° by the rotation.

As a result, after all four pulses are output, the nuclear spins in the slices 41 and 44 are in the rest position, with the exception of the spins in the area of intersection 45. A selective magnetization is achieved in the area of intersection 45 of the two slices 41 and 44.

Thus, after a pulse sequence in accordance with the present teachings is output, magnetization is present only in the desired field of excitation.

FIG. 7 shows a cross-section through the object of investigation 40, and shows the excited area of intersection 45 after a complete pulse sequence has been output. Different slices are selected in contrast to FIGS. 3-6. In some embodiments, as shown in FIG. 7, the slices 41 and 44 are not perpendicular to one another. Thus, the area of intersection does not have a rectangular cross-section.

The selection of the slices may be freely adapted to the object of investigation (e.g., to the desired FOX). The selection may be such that an area of intersection is provided by the two slices. In some embodiments, as shown in FIG. 7, the slices 41 and 44 enclose an angle α.

The selectivity achieved with a method in accordance with the present teachings depends on the selection of the slice-selective excitation pulse and, for example, on the shape of the high-frequency pulse. In some embodiments, sinc pulses are particularly suitable for use. However, the achievable selectivity is also influenced by inhomogeneities in the $B_0$ and $B_1$ field. It may be better the more completely that the nuclear spins are tilted back into the starting position by the third and the fourth slice-selective excitation pulse. Accordingly, in some embodiments, an HF pulse optimization unit is provided, with which a minimization problem may be resolved. The magnetization is predefined as the target magnetization in the desired FOX 45. As explained in reference to FIGS. 3-6, the basic pulse sequence is predefined within the pulse sequence. An optimized definition of the amplitude and phase of the high-frequency pulses may take inhomogeneities in the $B_1$ and $B_0$ field into account. For this purpose, the $B_1$ field may be taken into account in the HF pulse optimization unit on the basis of $B_1$ maps.

FIG. 8 shows such $B_1$ maps 51, 52, 53 and 54. A circle 50 shows the limit of the object of investigation 40. The map 51 shows the $B_1$ field that is generated by the antenna 104d, the map 52 shows the $B_1$ field generated by antenna 104c, the map 53 shows the $B_1$ field generated by the transmitting antenna 104b, and the map 54 shows the $B_1$ field generated by the antenna 104a. Lines 55 indicate the course of the field lines. Such $B_1$ maps provide information concerning the directionality and the beam properties of the transmitting antennae.

Figure 9:
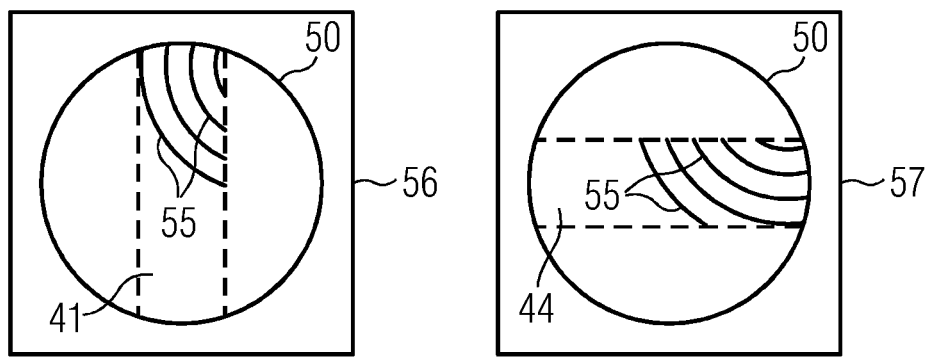
FIG. 9 shows a schematic representation of exemplary virtual B1 maps for a representative high-frequency transmission coil.

If the target area (e.g., the FOX) is specified, virtual $B_1$ maps are produced from the $B_1$ maps 51-54. By way of example, a virtual $B_1$ map 56 is shown in FIG. 9 that was produced from the $B_1$ map 52 for the antenna 104c. The virtual $B_1$ map in FIG. 9 is used for a slice-selective pulse in the x direction (only the part of the field that falls within the selected slice is shown). Accordingly, the virtual $B_1$ map 57 also applies for the antenna 104c and is also produced from the $B_1$ map 52. In contrast to the virtual $B_1$ map 56, the virtual $B_1$ map 57 is in the y direction for the case of slice-selective excitation.

The non-linear optimization process calculates amplitude and phase of each pulse for each individual channel according to equation (4) above. The equation system is completely defined by the definition of an area to be excited and a desired edge definition or selectivity and a quantity of pulses taking into account the total pulse sequence duration. The simple and short pulses 11-14 that are achieved are less susceptible to artifacts. The edge definition is defined by the high-frequency pulse shape and may easily be improved at the expense of specific absorption rate (SAR), or impaired in favor of SAR.

In some embodiments, a Levenberg-Marquardt solver may be used for the optimization program for non-linear equation systems.

In some embodiments, the sequence of gradient directions may be changed. For example, in some embodiments, the sequence that delivers the smallest deviation from the target may be calculated in the optimization unit.

Even though representative embodiments having a pulse sequence with four pulses have been described, it is to be understood that pulse sequences in accordance with the present teachings are not limited in this manner, and that in other embodiments, a greater quantity of pulses may also be employed. In some embodiments, a greater quantity of pulses increases the selectivity since more setting options (e.g., more degrees of freedom) are provided. However, as the number of pulses increases, the total duration of the pulse sequence may also increase, resulting in greater influence from inhomogeneities of time in the $B_0$ field and the $B_1$ field (e.g., as a result of patient movement).

The specification of a flip angle of 90° is not to be regarded as restrictive. In some embodiments, other flip angles may be provided. Coordination may exist between axes of rotation and flip angles so that the third and fourth excitation pulses, and possibly further excitation pulses, rotate the nuclear spins outside the FOX back to the equilibrium position.

The representative excited slices and pulse sequences described above are merely exemplary embodiments that may be modified in many different ways by a person skilled in the art, without departing from the scope of the invention. The use of the indefinite article "a" or "an" does not imply that more than one of the features concerned may not also be present. The use of the terms "unit" and "module" also do not imply that the components concerned may not include a plurality of interacting subcomponents, which may also be spatially distributed.

The foregoing detailed description and the accompanying drawings have been provided by way of explanation and illustration, and are not intended to limit the scope of the appended claims. Many variations in the presently preferred embodiments illustrated herein will be apparent to one of ordinary skill in the art, and remain within the scope of the appended claims and their equivalents.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding claim—whether independent or dependent—and that such new combinations are to be understood as forming a part of the present specification.

The invention claimed is:

1. A method configured for controlling a magnetic resonance system, the method comprising:
   outputting, by a processor, a pulse sequence for the magnetic resonance system;
   wherein the pulse sequence comprises:
      a first slice-selective excitation pulse configured to excite a first slice with a first magnetization;
      a second slice-selective excitation pulse configured to excite a second slice with a second magnetization, wherein the first slice and the second slice intersect, and wherein the second magnetization is configured such that the second magnetization has substantially no effect on the first magnetization while exciting the second slice including an intersection between the first slice and the second slice;
      a third slice-selective excitation pulse configured to excite the first slice with a third magnetization that substantially cancels the first magnetization; and
      a fourth slice-selective excitation pulse configured to excite the second slice with a fourth magnetization that substantially cancels the second magnetization, such that a measurement volume is substantially constricted to the intersection between the first slice and the second slice with the application of the first slice-selective excitation pulse, the second slice-selective excitation pulse, the third slice-selective excitation pulse, and the fourth slice-selective excitation pulse.

2. The method of claim 1, wherein each slice-selective excitation pulse of the first slice-selective excitation pulse, the second slice-selective excitation pulse, the third slice-selective excitation pulse, and the fourth slice-selective excitation pulse comprises a high-frequency pulse and a gradient signal, wherein a shape of the high-frequency pulse predefines a slice thickness of an excited slice and a delimitation accuracy between the excited slice and a non-excited area, and wherein the gradient signal predefines a slice plane.

3. The method of claim 2, wherein the high-frequency pulse comprises a sine pulse.

4. The method of claim 1, wherein the pulse sequence further comprises a refocusing pulse output for a third slice, wherein the third slice intersects with the first slice and the second slice.

5. The method of claim 2, wherein the pulse sequence further comprises a refocusing pulse output for a third slice, wherein the third slice intersects with the first slice and the second slice.

6. The method of claim 3, wherein the pulse sequence further comprises a refocusing pulse output for a third slice, wherein the third slice intersects with the first slice and the second slice.

7. The method of claim 4, wherein each slice-selective excitation pulse of the first slice-selective excitation pulse, the second slice-selective excitation pulse, the third slice-selective excitation pulse, and the fourth slice-selective excitation pulse comprises a high-frequency pulse, the high frequency pulse having an amplitude and a phase optimized such that, after the pulse sequence is output, any difference between overall excited magnetization and magnetization in an area of intersection of the first slice and the second slice, or of the first slice, the second slice, and the third slice, is minimized.

8. The method of claim 5, wherein each slice-selective excitation pulse of the first slice-selective excitation pulse, the second slice-selective excitation pulse, the third slice-selective excitation pulse, and the fourth slice-selective excitation pulse comprises a high-frequency pulse, the high frequency pulse having an amplitude and a phase optimized such that, after the pulse sequence is output, any difference between overall excited magnetization and magnetization in an area of intersection of the first slice and the second slice, or of the first slice, the second slice, and the third slice, is minimized.

9. The method of claim 6, wherein each slice-selective excitation pulse of the first slice-selective excitation pulse, the second slice-selective excitation pulse, the third slice-selective excitation pulse, and the fourth slice-selective excitation pulse comprises a high-frequency pulse, the high frequency pulse having an amplitude and a phase optimized such that, after the pulse sequence is output, any difference between overall excited magnetization and magnetization in an area of intersection of the first slice and the second slice, or of the first slice, the second slice, and the third slice, is minimized.

10. The method of claim 7, further comprising determining an actual distribution of a B1 field, the determining preceding the optimization of the amplitude and the phase, and wherein the optimization takes the B1 distribution into account.

11. The method of claim 8, further comprising determining an actual distribution of a B1 field, the determining preceding the optimization of the amplitude and the phase, and wherein the optimization takes the B1 distribution into account.

12. The method of claim 9, further comprising determining an actual distribution of a B1 field, the determining preceding the optimization of the amplitude and the phase, and wherein the optimization takes the B1 distribution into account.

13. The method of claim 7, further comprising determining an actual distribution of a Bo field, the determining preceding the optimization of the amplitude and the phase, and wherein the optimization takes the Bo distribution into account.

14. The method of claim 8, further comprising determining an actual distribution of a Bo field, the determining preceding the optimization of the amplitude and the phase, and wherein the optimization takes the Bo distribution into account.

15. The method of claim 9, further comprising determining an actual distribution of a Bo field, the determining preceding the optimization of the amplitude and the phase, and wherein the optimization takes the Bo distribution into account.

16. The method of claim 10, further comprising determining an actual distribution of a Bo field, the determining preceding the optimization of the amplitude and the phase, and wherein the optimization takes the Bo distribution into account.

17. The method of claim 11, further comprising determining an actual distribution of a Bo field, the determining preceding the optimization of the amplitude and the phase, and wherein the optimization takes the Bo distribution into account.

18. The method of claim 12, further comprising determining an actual distribution of a Bo field, the determining preceding the optimization of the amplitude and the phase, and wherein the optimization takes the Bo distribution into account.

19. The method of claim 1, wherein the magnetic resonance system comprises a transmitting antenna arrangement, the transmitting antenna arrangement comprising a plurality of independent high-frequency transmission channels, wherein at least two high-frequency transmission channels of the plurality of independent high-frequency transmission channels are operable to output independent pulse sequences in parallel, and wherein the independent pulse sequences each comprise the first slice-selective excitation pulse, the second slice-selective excitation pulse, the third slice-selective excitation pulse and the fourth slice-selective excitation pulse.

20. A control device configured for controlling a magnetic resonance system, the magnetic resonance system comprising one or more high-frequency transmission channels, wherein:
the control device is coupled with at least one of the one or more high-frequency transmission channels; and
the control device is configured to emit a control signal to the at least one high-frequency transmission channels;
wherein the control signal is operable to cause emissions of:
a first slice-selective excitation pulse configured to excite a first slice with a first magnetization,
a second slice-selective excitation pulse configured to excite a second slice with a second magnetization, wherein the first slice and the second slice intersect, and wherein the second magnetization has substantially no effect on the first magnetization during excitation of the second slice including an intersection between the first slice and the second slice,
a third slice-selective excitation pulse configured to excite the first slice with a third magnetization that substantially cancels the first magnetization, and
a fourth slice-selective excitation pulse configured to excite the second slice with a fourth magnetization that substantially cancels the first magnetization, such that a measurement volume is substantially constricted to the intersection between the first slice and the second slice with the application of the first slice-selective excitation pulse, the second slice-selective excitation pulse, the third slice-selective excitation pulse, and the fourth slice-selective excitation pulse.

21. A magnetic resonance tomography system comprising:
a control device configured for controlling a magnetic resonance system, the magnetic resonance system comprising one or more high-frequency transmission channels, wherein:
the control device is coupled with at least one of the one or more high-frequency transmission channels; and
the control device is configured to emit a control signal to the at least one high-frequency transmission channels;
wherein the control signal is operable to cause emissions of:
a first slice-selective excitation pulse configured to excite a first slice with a first magnetization,
a second slice-selective excitation pulse configured to excite a second slice with a second magnetization, wherein the first slice and the second slice intersect, and wherein the second magnetization has substantially no effect on the first magnetization during excitation of the second slice including an intersection between the first slice and the second slice,
a third slice-selective excitation pulse configured to excite the first slice with a third magnetization that substantially cancels the first magnetization, and
a fourth slice-selective excitation pulse configured to excite the second slice with a fourth magnetization that substantially cancels the first magnetization, such that a measurement volume is substantially constricted to the intersection between the first slice and the second slice with the application of the first slice-selective excitation pulse, the second slice-selective excitation pulse, the third slice-selective excitation pulse, and the fourth slice-selective excitation pulse.

22. A control sequence determination device configured for determining a magnetic resonance system control sequence including a pulse sequence, the control sequence determination device comprising:
an input interface configured for recording a target magnetization;
an HF pulse optimization unit configured to calculate, in a high frequency (HF) pulse optimization, amplitudes and phases of pulses based on the target magnetization and an optimized pulse sequence predefined according to quantity and shape of the pulses; and
a control sequence output interface;
wherein the control sequence determination device is configured such that in the HF pulse optimization, the control sequence determination device uses a model based on Bloch equations;
wherein a spatial shape of a desired excitation volume is predefined as the target magnetization,
wherein the target magnetization is defined by an intersection of multiple slices excited by the optimized pulse sequence, and
wherein the optimized pulse sequence is operable to cause emissions of:
a first slice-selective excitation pulse configured to excite a first slice with a first magnetization;
a second slice-selective excitation pulse configured to excite a second slice with a second magnetization, wherein the first slice and the second slice intersect, and wherein the second magnetization is configured such that the second magnetization has substantially no effect on the first magnetization while exciting the second slice including an intersection between the first slice and the second slice;
a third slice-selective excitation pulse configured to excite the first slice with a third magnetization that substantially cancels the first magnetization; and
a fourth slice-selective excitation pulse configured to excite the second slice with a fourth magnetization that substantially cancels the second magnetization, such that a measurement volume is substantially constricted to the intersection between the first slice and the second slice with the application of the first slice-selective excitation pulse, the second slice-selective excitation pulse, the third slice-selective excitation pulse, and the fourth slice-selective excitation pulse.

23. The control sequence determination device of claim 22, wherein the HF pulse optimization takes into account a B1 map of one or more high-frequency transmission channels to be used for emission of the pulse sequence.

24. In a non-transitory computer readable storage medium having stored therein data representing instructions executable by a programmed processor for controlling a magnetic resonance system, the non-transitory computer readable storage medium comprising instructions configured for outputting a pulse sequence;

wherein the pulse sequence comprises:

a first slice-selective excitation pulse configured to excite a first slice with a first magnetization;

a second slice-selective excitation pulse configured to excite a second slice with a second magnetization, wherein the first slice and the second slice intersect, and wherein the second magnetization has substantially no effect on the first magnetization while exciting the second slice including an intersection between the first slice and the second slice;

a third slice-selective excitation pulse configured to excite the first slice with a third magnetization that substantially cancels the first magnetization; and a fourth slice-selective excitation pulse configured to excite the second slice with a fourth magnetization that substantially cancels the second magnetization, such that a measurement volume is substantially constricted to the intersection between the first slice and the second slice with the application of the first slice-selective excitation pulse, the second slice-selective excitation pulse, the third slice-selective excitation pulse, and the fourth slice-selective excitation pulse.

\* \* \* \* \*